(12) United States Patent
Dai et al.

(10) Patent No.: US 12,016,221 B2
(45) Date of Patent: Jun. 18, 2024

(54) DISPLAY SUBSTRATE HAVING A DISPLAY REGION AND A NON-DISPLAY REGION SURROUNDING THE DISPLAY REGION AND METHOD FOR MANUFACTURING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jie Dai, Beijing (CN); Pengfei Yu, Beijing (CN); Siyu Wang, Beijing (CN); Shun Zhang, Beijing (CN); Yi Zhang, Beijing (CN); Tingliang Liu, Beijing (CN); Sen Du, Beijing (CN); Li Song, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 488 days.

(21) Appl. No.: 17/298,439

(22) PCT Filed: Sep. 2, 2020

(86) PCT No.: PCT/CN2020/113017
§ 371 (c)(1),
(2) Date: May 28, 2021

(87) PCT Pub. No.: WO2022/047664
PCT Pub. Date: Mar. 10, 2022

(65) Prior Publication Data
US 2022/0320224 A1 Oct. 6, 2022

(51) Int. Cl.
*H10K 59/131* (2023.01)
*H10K 59/12* (2023.01)

(52) U.S. Cl.
CPC ....... *H10K 59/131* (2023.02); *H10K 59/1201* (2023.02)

(58) Field of Classification Search
CPC .. H10K 59/131; H10K 59/1201; H10K 59/87; H10K 59/124; H10K 2102/311; H10K 50/844; H10K 59/873
See application file for complete search history.

(56) References Cited

U.S. PATENT DOCUMENTS 10,748,974 B2 *  8/2020  Lee ................. H10K 59/124
2008/0218091 A1 * 9/2008  Jo .................... H10K 71/00
                                                445/24

(Continued)

FOREIGN PATENT DOCUMENTS

CN    109713017 A    5/2019
CN    110061043 A    7/2019
(Continued)

*Primary Examiner* — Khiem D Nguyen
(74) *Attorney, Agent, or Firm* — Brooks Kushman P.C.

(57) ABSTRACT

A display substrate, a method for manufacturing the display substrate and a display device are provided. The display substrate includes a display region and a non-display region surrounding the display region. The display substrate further includes: an organic functional layer including a first portion located in the display region and a second portion located in the non-display region. The second portion is provided with at least one isolation groove, and is partitioned into at least two separate sub-portions by the at least one isolation groove, and the at least two sub-portions are arranged sequentially along a first direction from the display region to a boundary of the display substrate.

15 Claims, 2 Drawing Sheets

(56) References Cited

U.S. PATENT DOCUMENTS

| | | | |
|---|---|---|---|
| 2018/0130824 A1* | 5/2018 | French | H01L 23/64 |
| 2019/0041711 A1* | 2/2019 | Fujikawa | G02F 1/1309 |
| 2019/0229164 A1* | 7/2019 | Kim | H10K 59/123 |
| 2020/0127233 A1* | 4/2020 | Sung | H10K 77/111 |
| 2020/0174528 A1* | 6/2020 | Park | H10K 71/00 |
| 2020/0176709 A1* | 6/2020 | Moon | H10K 59/40 |
| 2020/0194534 A1 | 6/2020 | Park et al. | |
| 2020/0350512 A1 | 11/2020 | Guo et al. | |
| 2021/0074788 A1 | 3/2021 | Cheng et al. | |

FOREIGN PATENT DOCUMENTS

| | | |
|---|---|---|
| CN | 110085759 A | 8/2019 |
| CN | 110854304 A | 2/2020 |
| CN | 111326554 A | 6/2020 |
| KR | 20130137455 A | 12/2013 |

* cited by examiner

DISPLAY SUBSTRATE HAVING A DISPLAY REGION AND A NON-DISPLAY REGION SURROUNDING THE DISPLAY REGION AND METHOD FOR MANUFACTURING THE SAME

CROSS-REFERENCE TO RELATED APPLICATION

This application is the U.S. national phase of PCT Application No. PCT/CN2020/113017 filed on Sep. 2, 2020, which is incorporated herein by reference in its entirety.

TECHNICAL FIELD

The present disclosure relates to the field of display technologies, in particular to a display substrate, a method for manufacturing the display substrate, and a display device.

BACKGROUND

A flexible display panel in which an organic light-emitting diode (OLED) is used as a light-emitting device and signal control is conducted through a thin film transistor has become mainstream in conventional OLED industry. Generally, a thin film encapsulation process is used to encapsulate the flexible display panel, so as to guard the light-emitting device and other structures inside the panel against oxidation by external influences.

SUMMARY

An object of the present disclosure is to provide a display substrate, a method for manufacturing the display substrate and a display device.

The present disclosure provides, in a first aspect, a display substrate. The display substrate includes: a display region and a non-display region surrounding the display region. The display substrate further includes: an organic functional layer including a first portion located in the display region and a second portion located in the non-display region. The second portion is provided with at least one isolation groove, and is partitioned into at least two separate sub-portions by the at least one isolation groove, and the at least two sub-portions are arranged sequentially along a first direction from the display region to a boundary of the display substrate.

Optionally, the at least one isolation groove surrounds the display region, each of the at least two sub-portions surrounds the display region, and the at least two sub-portions are arranged in a manner in which an outer sub-portion surrounds an inner sub-portion.

Optionally, the second portion is provided with a first isolation groove and a second isolation groove, and the first isolation groove is located between the display region and the second isolation groove. The second portion is partitioned by the first isolation groove and the second isolation groove into a first sub-portion, a second sub-portion and a third sub-portion, and the first sub-portion, the second sub-portion and the third sub-portion are separate from each other, and are sequentially arranged in a spaced manner along the first direction.

Optionally, the display substrate further includes: a circuit structure located in the non-display region, where an orthographic projection of the circuit structure onto a base substrate of the display substrate is covered by an orthographic projection of the second sub-portion onto the base substrate; a first signal line structure located in the non-display region, where an orthographic projection of the first signal line structure onto the base substrate is covered by an orthographic projection of the first sub-portion onto the base substrate; and a second signal line structure located in the non-display region, where an orthographic projection of the second signal line structure onto the base substrate is covered by an orthographic projection of the third sub-portion onto the base substrate.

Optionally, the circuit structure includes a gate driver circuit, a test circuit and a multiplexing circuit, the first signal line structure includes a power signal line, and the second signal line structure includes a test signal line and a clock signal line.

Optionally, the organic functional layer includes a first planarization layer, a second planarization layer and/or a pixel definition layer.

Optionally, the display substrate further includes an electrically conductive functional pattern located in the non-display region, and an orthographic projection of the isolation groove onto the base substrate of the display substrate does not overlap an orthographic projection of the electrically conductive functional pattern onto the base substrate.

Optionally, the display substrate further includes an inorganic functional layer located in the non-display region; an orthographic projection of the isolation groove onto the base substrate of the display substrate overlaps an orthographic projection of the inorganic functional layer onto the base substrate.

Based on the technical solution of the display substrate, the present disclosure provides, in a second aspect, a display device. The display device includes the above-mentioned display substrate.

Optionally, the display device includes a circular watch.

Based on the technical solution of the display substrate, the present disclosure provides, in a third aspect, a method for manufacturing a display substrate. The display substrate includes a display region and a non-display region surrounding the display region, and the method includes: forming an organic functional layer, where the organic functional layer includes a first portion located in the display region and a second portion located in the non-display region, the second portion is provided with at least one isolation groove, and is partitioned into at least two separate sub-portions by the at least one isolation groove, and the at least two sub-portions are arranged sequentially along a first direction from the display region to a boundary of the display substrate.

Optionally, the organic functional layer includes a planarization layer provided with a via-hole structure, and the via-hole structure is configured to connect an anode pattern to a corresponding sub-pixel driver circuit in the display substrate, forming the at least one isolation groove in the organic functional layer specifically includes: forming the via-hole structure and the at least one isolation groove simultaneously in one patterning process.

BRIEF DESCRIPTION OF THE DRAWINGS

The following drawings are provided to facilitate the understanding of the present disclosure, and constitute a portion of the present disclosure. These drawings and the following embodiments are for illustrative purposes only, and shall not be construed as limiting the present disclosure. In these drawings.

DETAILED DESCRIPTION

In order to further illustrate a display substrate, a method for manufacturing the display substrate and a display device in the embodiments of the present disclosure, a detailed description will be given below with reference to the drawings.

When a flexible display panel is encapsulated, two inorganic encapsulation layers are generally formed by using a chemical vapor deposition (CVD) process. However, in the case that the encapsulation fails, for example, the inorganic encapsulation layer is broken to generate a crack, moisture and oxygen may intrude into the inside of the display panel through the crack.

There are a large number of polar groups in a molecular structure of an organic material, and these groups are capable of combining with water molecules to form hydrogen bonds, while an inorganic material is not water absorbent. Once the inorganic encapsulation layer around the display panel cracks and moisture and oxygen in the environment enters the inside of the display panel, the moisture and oxygen will gradually spread along an organic functional layer made of an organic material toward the display region and erode the display region, causing a light-emitting layer in the display region to be oxidized and unable to emit light. A failure region may gradually expand with continuous intrusion of moisture and oxygen, such that the display device develops a distinctive defect: a growing dark spot (GDS).

Figure 1:
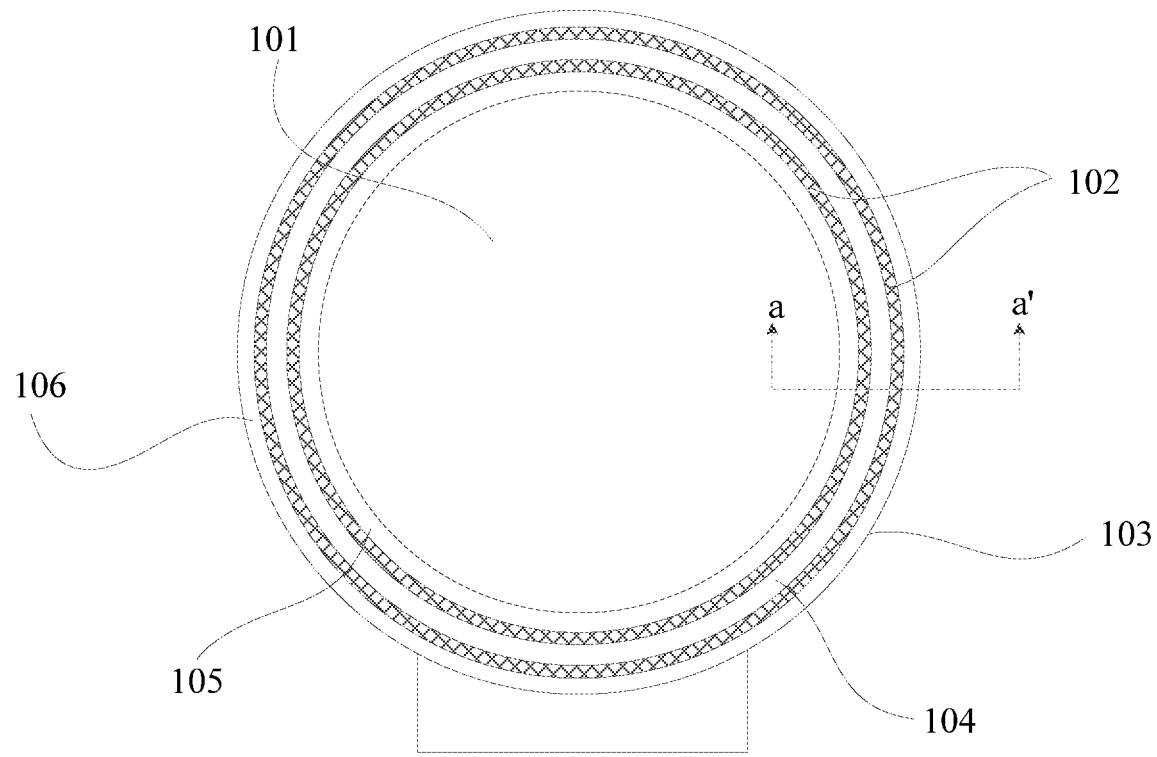
FIG. 1 is a schematic structural diagram of a display substrate according to an embodiment of the present disclosure.
Figure 2:
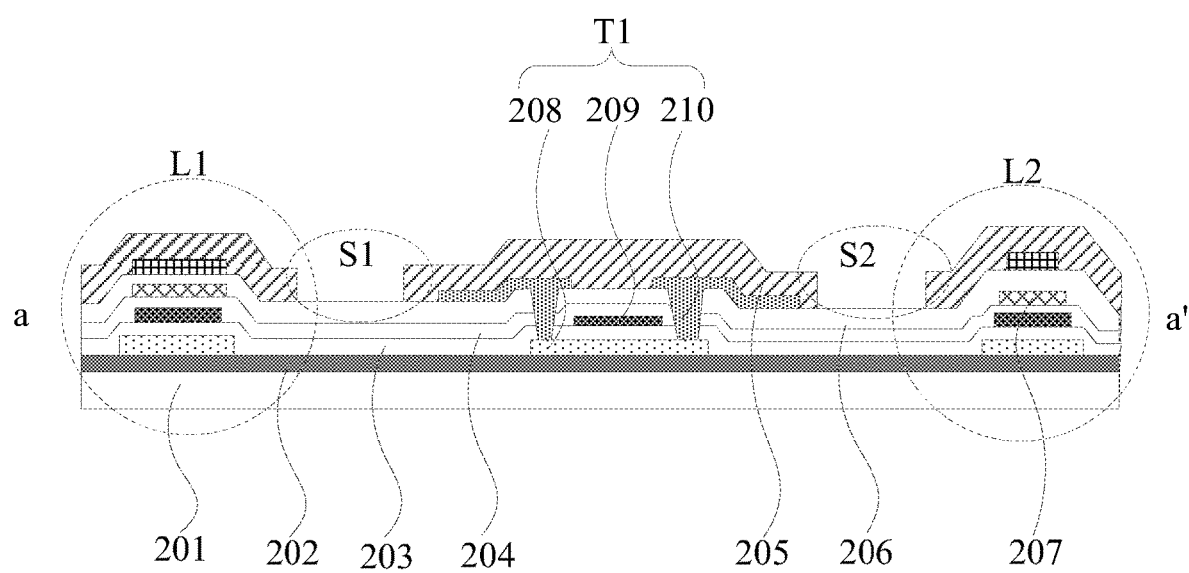
FIG. 2 is a cross-sectional view, taken along an aa' direction, of the display substrate in FIG. 1.

Referring to FIG. 1 and FIG. 2, a display substrate is provided in an embodiment of the present disclosure. The display substrate includes: a display region 101 and a non-display region surrounding the display region 101. The display substrate further includes: an organic functional layer including a first portion located in the display region 101 and a second portion located in the non-display region. The second portion is provided with at least one isolation groove 102, and the at least one isolation groove 102 may partition the second portion into at least two sub-portions which are separate from each other. The at least two sub-portions are arranged sequentially along a first direction from the display region 101 to a boundary 103 of the display substrate.

Specifically, the display substrate includes the display region 101 and the non-display region surrounding the display region 101. For example, the display region 101 is of a circular shape or a rectangular shape, and an outer boundary contour of the non-display region is approximately the same as that of the display region 101. When the display region 101 is of the circular shape, the first direction is a radius direction of the circle.

The organic functional layer includes the first portion located in the display region 101 and the second portion located in the non-display region. The first portion and the second portion are simultaneously formed in one patterning process. The second portion is provided with at least one isolation groove 102, and the at least one isolation groove 102 may partition the second portion into at least two sub-portions which are separate from each other. For example, a sub-portion of the at least two sub-portions that is closest to the display region 101 may form an integral structure with the first portion.

The isolation groove 102 is formed by removing a part of the organic functional layer in the second portion, and the quantity and widths of the isolation grooves 102 may be set according to practical needs. The at least one isolation groove 102 may partition the second portion into the at least two sub-portions, which are separate from each other, and are sequentially arranged in a spaced manner along the first direction from the display region 101 to the boundary 103 of the display substrate. That is, none of the at least two sub-portions extends from the boundary 103 of the display substrate to the display region 101.

It should be appreciated that, in the case that the display substrate includes a plurality of isolation grooves 102, the plurality of isolation grooves 102 are sequentially arranged along the first direction.

It can be learnt from the above specific display substrate structure, in the display substrate of the embodiment of the present disclosure, the isolation groove 102 is provided in the organic functional layer in the non-display region, the isolation groove 102 partitions the second portion, which is located in the non-display region, of the organic functional layer into at least two sub-portions which are separate from each other, and the at least two sub-portions may be sequentially arranged in a spaced manner along the first direction from the display region 101 to the boundary 103 of the display substrate. In this way, in the case that an edge of the inorganic encapsulation layer of the display substrate is broken to generate a crack, and moisture and oxygen intrude through the crack into the sub-portion of the non-display region that is closest to the boundary of the display substrate, the moisture and oxygen will not continue to intrude into the display region 101 by using the organic functional layer in the non-display region as a transmission path, since the sub-portions in the non-display region are separate from each other. Therefore, in the display substrate of the embodiment of the present disclosure, thanks to the isolation groove 102, the moisture and oxygen may be effectively confined to the non-display region, thus the moisture and oxygen are prevented from rapidly intruding into the display region 101 of the display substrate, the risk of the GDS defect in the display substrate is reduced, and the service life of the display substrate is effectively prolonged.

There are a variety of specific structures of the isolation groove 102 and a variety of specific structures of the sub-portions. In some embodiments, the isolation groove 102 is arranged to surround the display region 101, each sub-portion surrounds the display region 101, and the at least two sub-portions are arranged in a manner in which an outer sub-portion surrounds an inner sub-portion.

Specifically, both the isolation groove 102 and the sub-portions surround the display region 101. The sub-portion and the isolation groove 102 are arranged in an alternating fashion, with an outer sub-portion or isolation groove surrounding an inner isolation groove or sub-portion, and there is one isolation groove 102 between every two adjacent sub-portions.

With the above arrangement, it is possible to effectively confine moisture and oxygen to the non-display region at any position around the display region 101, thus the moisture and oxygen are prevented from rapidly intruding into the display region 101 of the display substrate, the risk of the GDS defect in the display substrate is reduced, and the service life of the display substrate is effectively prolonged.

Referring to FIG. 1 and FIG. 2, in some embodiments, the second portion is provided with a first isolation groove (for example, at S1 in FIG. 2) and a second isolation groove (for example, at S2 in FIG. 2), and the first isolation groove is located between the display region 101 and the second isolation groove. The second portion is partitioned by the first isolation groove and the second isolation groove into a first sub-portion, a second sub-portion and a third sub-portion, and the first sub-portion, the second sub-portion and the third sub-portion are separate from each other and arranged in a spaced manner along the first direction.

For example, both the first isolation groove and the second isolation groove surround the display region 101, the first isolation groove and the second isolation groove are arranged in a manner in which the first isolation groove is surrounded by the second isolation groove, and the first isolation groove is located between the display region 101 and the second isolation groove. The first sub-portion, the second sub-portion and the third sub-portion all surround the display region 101. Along the first direction, the first sub-portion, the first isolation groove, the second sub-portion, the second isolation groove and the third sub-portion are arranged sequentially, with an outer sub-portion surrounding an inner isolation groove and an outer isolation groove surrounding an inner sub-portion.

In the case that moisture and oxygen enter the inside of the display substrate through the crack at the edge of the display substrate, the moisture and oxygen is in contact with the third sub-portion firstly. Because the second isolation groove 102 is provided between the third sub-portion and the second sub-portion, the moisture and oxygen will not rapidly intrude from the third sub-portion into the second sub-portion. Similarly, since the first isolation groove is provided between the second sub-portion and the first sub-portion, in the case that the moisture and oxygen intrude into the second sub-portion, the moisture and oxygen will not rapidly intrude from the second sub-portion into the first sub-portion. Therefore, the foregoing arrangement provides in the non-display region a multi-level barrier structure against moisture and oxygen, thus the moisture and oxygen are prevented from rapidly intruding into the display region 101 of the display substrate, the risk of the GDS defect in the display substrate is reduced, and the service life of the display substrate is effectively prolonged.

Referring to FIG. 1 and FIG. 2, in some embodiments, the display substrate further includes: a circuit structure 104 located in the non-display region, where an orthographic projection of the circuit structure 104 onto a base substrate 201 of the display substrate is covered by an orthographic projection of the second sub-portion onto the base substrate 201; a first signal line structure 105 located in the non-display region, where an orthographic projection of the first signal line structure 105 onto the base substrate 201 is covered by an orthographic projection of the first sub-portion onto the base substrate 201; and a second signal line structure 106 located in the non-display region, where an orthographic projection of the second signal line structure 106 onto the base substrate 201 is covered by an orthographic projection of the third sub-portion onto the base substrate 201.

Specifically, the display substrate further includes the circuit structure 104, the first signal line structure 105 and the second signal line structure 106 in the non-display region. For example, the circuit structure 104, the first signal line structure 105 and the second signal line structure 106 are all arranged between the base substrate 201 and the organic functional layer. With this arrangement, the organic functional layer is able to provide a certain protection to the circuit structure 104, the first signal line structure 105 and the second signal line structure 106.

For example, the orthographic projection of the circuit structure 104 onto the base substrate 201 is between an orthographic projection of the first isolation groove 102 onto the base substrate 201 and an orthographic projection of the second isolation groove 102 onto the base substrate 201. The orthographic projection of the first signal line pattern onto the base substrate 201 is between an orthographic projection of the display region 101 onto the base substrate 201 and the orthographic projection of the first isolation groove 102 onto the base substrate 201. The orthographic projection of the second signal line pattern onto the base substrate 201 is between the orthographic projection of the second isolation groove 102 onto the base substrate 201 and the boundary 103 of the display substrate.

For example, along the first direction, a width of a region occupied by the circuit structure 104 is larger than a width of a region occupied by the first signal line structure 105, and is larger than a width of a region occupied by the second signal line structure 106.

For example, the circuit structure 104, the first signal line structure 105 and the second signal line structure 106 are all arranged on the periphery of the display substrate.

In the display substrate of the above embodiment, the orthographic projection of the circuit structure 104 onto the base substrate 201 of the display substrate is covered by the orthographic projection of the second sub-portion onto the base substrate 201, the orthographic projection of the first signal line structure 105 onto the base substrate 201 is covered by the orthographic projection of the first sub-portion onto the base substrate 201, and the orthographic projection of the second signal line structure 106 onto the base substrate 201 is covered by the orthographic projection of the third sub-portion onto the base substrate 201, such that, along the first direction, both a width of the first sub-portion and a width of the third sub-portion are smaller than a width of the second sub-portion. In this way, the first sub-portion in contact with the first portion of the organic functional layer is far away from the boundary of the display region 101 and there is a large distance between the first sub-portion and the boundary 103 of the display substrate, thus the moisture and oxygen are prevented from rapidly intruding into the display region 101 of the display substrate, the risk of the GDS defect in the display substrate is reduced, and the service life of the display substrate is effectively prolonged.

As shown in FIG. 1 and FIG. 2, in some embodiments, the circuit structure 104 includes a gate driver circuit, a test circuit and a multiplexing circuit, the first signal line structure 105 includes a power signal line, and the second signal line structure 106 includes a test signal line and a clock signal line.

Specifically, the gate driver circuit (GOA) is configured to provide a gate signal to a gate line in the display region 101. The test circuit is configured to test a display image quality of the display substrate. The multiplexing circuit is connected between a source chip of the display substrate and a data line in the display region 101, and configured to charge the data line. The gate driver circuit, the test circuit and the multiplexing circuit are arranged on the periphery of the display substrate.

The first signal line structure 105 includes the power signal line, and the power signal line is configured to provide a power voltage signal to sub-pixels in the display region 101. L1 in FIG. 2 represents a position where the first signal line structure 105 is formed, and L2 represents a position where the second signal line structure 106 is formed.

The second signal line structure 106 includes the test signal line, the clock signal line, etc. For example, the test signal line is configured to provide a test signal to the test circuit, and the clock signal line is configured to provide a clock signal to the gate driver circuit.

More specifically, as shown in FIG. 2, the base substrate 201 in the display substrate may be a polyimide (PI) substrate. A barrier layer, a buffer layer (202 in FIG. 2 denotes the barrier layer and the buffer layer), an active layer, a first gate insulation layer 203, a first gate metal layer, a second gate insulation layer 204, a second gate metal layer, an interlayer insulation layer 206, a source-drain metal layer and a first planarization layer 205 are sequentially arranged in a stacked manner on the base substrate 201 in a direction away from the base substrate 201.

For example, the first gate insulation layer 203 is made of SiOx. The first gate insulation layer 203 acts as a dielectric layer between the first gate metal layer and the active layer. More specifically, the first gate insulation layer 203 acts as an insulation layer between a gate electrode of a transistor and an active pattern in the display substrate. It should be appreciated that the gate electrode of the transistor is formed by the first gate metal layer, and a channel layer of the transistor is formed by the active layer.

For example, the second gate insulation layer 204 is made of SiNx. The second gate insulation layer 204 acts as a dielectric layer between the first gate metal layer and the second gate metal layer. More specifically, the second gate insulation layer 204 acts as an insulation layer between a first electrode plate and a second electrode plate of a capacitor structure in the display substrate. It should be appreciated that the first electrode plate of the capacitor structure is formed by the first gate metal layer, and the second electrode plate of the capacitor structure is formed by the second gate metal layer.

The interlayer insulation layer 206 acts as an insulation layer between the second gate metal layer and a first source-drain metal layer. Some via-holes are formed in the interlayer insulation layer 206, and the first source-drain metal layer is electrically connected to a film layer located between the interlayer insulation layer 206 and the base substrate 201 through the via-holes.

It should be appreciated that, as shown in FIG. 2, the active layer is used to form an active pattern 208 of the transistor and some electrically conductive functional parts. The first gate metal layer is used to form the gate electrode 209 of the transistor, the first electrode plate of the capacitor structure, and some signal lines with electrically conductive functions. The first source-drain metal layer is used to form a source electrode and a drain electrode (e.g., as shown by reference numeral 210 in FIG. 2) of the transistor. The second gate metal layer is used to form the second electrode plate of the capacitor structure and some signal lines 207 with electrically conductive functions.

In FIG. 2, the transistor T1 includes the active pattern 208, the gate electrode 209, the source electrode and the drain electrode (e.g., as shown by reference numeral 210). The active pattern 208 and the gate electrode 209 form a channel structure of the transistor T1. The source electrode and the drain electrode are connected to two ends of the active pattern 208 through the via-holes in the interlayer insulation layer 206, via-holes in the second gate insulation layer 204 and via-holes in the first gate insulation layer 203.

It should be appreciated that, a position where the transistor T1 is formed represents a position where the GOA circuit providing the gate driving signal to the sub-pixels of the display region 101, the test circuit providing the test signal and the multiplexing circuit charging the data line are formed.

With the foregoing arrangement, the first signal line structure 105 includes the power signal line, so that the power signal line is closer to an electrically conductive pattern for transmitting the power signal in the display region 101, thus the stability of the power signal is improved in the case that the power signal line is electrically connected to the electrically conductive pattern.

With the foregoing arrangement, the circuit structure includes the gate driver circuit, the test circuit and the multiplexing circuit, and the second signal line structure 106 includes the test signal line and the clock signal line, so that the gate driver circuit, the test circuit and the multiplexing circuit are closer to respective signal lines that provide the power signal, the test signal, and the clock signal respectively, thus, not only the difficulty of designing the specific layout of the gate driver circuit, the test circuit and the multiplexing circuit is reduced, but also a layout space occupied by the circuit structure, the first signal line structure 105 and the second signal line structure 106 is reduced, which facilitates a narrow bezel design.

As shown in FIG. 1 and FIG. 2, in some embodiments, the organic functional layer includes a first planarization layer 205, a second planarization layer and/or a pixel definition layer.

Specifically, the display substrate further includes a sub-pixel driver circuit arranged in the display region 101, and the sub-pixel driver circuit may be formed simultaneously with the gate driver circuit, the test circuit and the multiplexing circuit. After these circuit structures are formed, the first planarization layer 205 may be formed subsequently. The first planarization layer 205 includes a first portion in the display region 101 and a second portion in the non-display region. The first planarization layer 205 is made of an organic material, and is used to flatten a level difference generated by structures below the first planarization layer 205.

After the first planarization layer 205 is formed, the pixel definition layer may be subsequently formed on a side of the first planarization layer 205 away from the base substrate 201. The pixel definition layer is used to define a plurality of pixel opening regions in the display region 101. For example, the pixel definition layer may include a first portion in the display region 101 and a second portion in the non-display region.

In some cases, the display substrate may further include the second planarization layer between the first planarization layer 205 and the pixel definition layer. For example, the second planarization layer includes a first portion in the display region 101 and a second portion in the non-display region.

It should be appreciated that, when the organic functional layer includes the first planarization layer 205, the second planarization layer and the pixel definition layer, orthographic projections of the isolation grooves 102 formed in the organic functional layers onto the base substrate 201 may overlap, or not overlap each other.

In some embodiments, the display substrate further includes an electrically conductive functional pattern located in the non-display region, and an orthographic projection of the isolation groove 102 onto the base substrate 201 of the display substrate does not overlap an orthographic projection of the electrically conductive functional pattern onto the base substrate 201.

Specifically, with the foregoing arrangement, there is no electrically conductive functional pattern directly below a region where the isolation groove 102 is formed, thus a process of forming the isolation groove 102 is prevented from affecting the electrically conductive functional pattern underneath.

In some embodiments, the display substrate further includes an inorganic functional layer located in the non-display region; an orthographic projection of the isolation groove 102 onto the base substrate 201 of the display substrate overlaps an orthographic projection of the inorganic functional layer onto the base substrate 201.

Specifically, the inorganic functional layer includes the first gate insulation layer 203, the second gate insulation layer 204 and the interlayer insulation layer 206. Only the inorganic functional layer is arranged directly below the isolation groove 102. In this way, the isolation groove 102 may cut off every organic functional layer located in the non-display region, thus the moisture and oxygen are prevented from rapidly intruding into the display region 101 of the display substrate, the risk of the GDS defect in the display substrate is reduced, and the service life of the display substrate is effectively prolonged.

A display device is further provided in an embodiment of the present disclosure. The display device includes the display substrate provided in the foregoing embodiments.

In the display substrate of the embodiment of the present disclosure, the isolation groove 102 is provided in the organic functional layer located in the non-display region, and the second portion of the organic functional layer that is located in the non-display region is partitioned into at least two separate sub-portions by the isolation groove 102, and the at least two sub-portions may be arranged in a spaced manner along the first direction from the display region 101 to the boundary 103 of the display substrate. In this way, in the case that an edge of the inorganic encapsulation layer of the display substrate is broken to generate a crack, and moisture and oxygen intrude through the crack into the sub-portion of the non-display region that is closest to the boundary of the display substrate, the moisture and oxygen will not continue to intrude into the display region 101 by using the organic functional layer in the non-display region as a transmission path, since the sub-portions in the non-display region are separate from each other. Therefore, in the display substrate of the embodiment of the present disclosure, thanks to the isolation groove 102, the moisture and oxygen may be effectively confined to the non-display region, thus the moisture and oxygen are prevented from rapidly intruding into the display region 101 of the display substrate, the risk of the GDS defect in the display substrate is reduced, and the service life of the display substrate is effectively prolonged.

Therefore, the display device in the embodiment of the present disclosure, when including the above-mentioned display substrate, also has the above-mentioned beneficial effects, which are not repeated herein.

It should be appreciated that the display device may be any product or component with a display function, such as a television, a display, a digital photo frame, a mobile phone, a tablet computer.

In some embodiments, the display device includes a circular watch.

For example, the display device includes a flexible wearable watch.

A method for manufacturing the display substrate of the foregoing embodiments is further provided in an embodiment of the present disclosure. The display substrate includes a display region 101 and a non-display region surrounding the display region 101, and the method includes: forming an organic functional layer, where the organic functional layer includes a first portion located in the display region 101 and a second portion located in the non-display region, the second portion is provided with at least one isolation groove 102, and is partitioned into at least two separate sub-portions by the at least one isolation groove 102, and the at least two sub-portions are arranged sequentially along a first direction from the display region 101 to a boundary 103 of the display substrate.

Specifically, the display substrate includes the display region 101 and the non-display region surrounding the display region 101. For example, the display region 101 is of a circular shape or a rectangular shape, and an outer boundary contour of the non-display region is approximately the same as that of the display region 101. When the display region 101 is of the circular shape, the first direction is a radius direction of the circle.

The organic functional layer includes the first portion in the display region 101 and the second portion in the non-display region. The first portion and the second portion are simultaneously formed in one patterning process. The second portion is provided with at least one isolation groove 102, and may be partitioned into at least two separate sub-portions by the at least one isolation groove 102. For example, one sub-portion of the at least two sub-portions closest to the display region 101 and the first portion form an integral structure.

A part of the organic functional layer in the second portion is removed, so as to form the isolation groove 102, and the quantity and widths of the isolation grooves 102 may be set according to practical needs. The second portion may be partitioned into the at least two separate sub-portions by the at least one isolation groove 102, and the at least two sub-portions are arranged in a spaced manner along the first direction from the display region 101 to the boundary 103 of the display substrate. That is, none of the at least two sub-portions extends from the boundary 103 of the display substrate to the display region 101.

In the display substrate manufactured by using the method of the embodiment of the present disclosure, the isolation groove 102 is provided in the organic functional layer located in the non-display region, and the second portion of the organic functional layer located in the non-display region is partitioned into at least two separate sub-portions by the isolation groove 102, and the at least two sub-portions may be sequentially arranged in a spaced manner along the first direction from the display region 101 to the boundary 103 of the display substrate. In this way, in the case that an edge of the inorganic encapsulation layer in the display substrate is broken to generate a crack, and moisture and oxygen intrude through the crack into the sub-portion of the non-display region that is closest to the boundary of the display substrate, the moisture and oxygen will not continue to intrude into the display region 101 by using the organic functional layer in the non-display region as a transmission path, since the sub-portions in the non-display region are separate from each other. Therefore, in the display substrate manufactured according to the method of the embodiment of the present disclosure, thanks to the isolation groove 102, the moisture and oxygen may be effectively confined to the non-display region, thus the moisture and oxygen are prevented from rapidly intruding into the display region 101 of the display substrate, the risk of the GDS defect in the display substrate is reduced, and the service life of the display substrate is effectively prolonged.

In some embodiments, the organic functional layer includes a planarization layer. The planarization layer is provided with a via-hole structure, and the via-hole structure is configured to connect an anode pattern to a corresponding sub-pixel driver circuit in the display substrate. A step of forming the at least one isolation groove 102 in the organic functional layer specifically includes: forming the via-hole structure and the at least one isolation groove 102 simultaneously in one patterning process.

For example, the organic functional layer includes a first planarization layer 205, a sub-pixel driver circuit is arranged between the first planarization layer 205 and the base substrate 201 of the display substrate, an anode pattern is arranged on a side of the first planarization layer 205 away from the base substrate 201, and a via-hole structure is provided in the planarization layer, and is configured to connect the anode pattern to the corresponding sub-pixel driver circuit in the display substrate.

In the method for manufacturing the display substrate according to the embodiment, the via-hole structure and the at least one isolation groove 102 are formed simultaneously in one patterning process, thus an additional patterning process for forming the isolation groove 102 is avoided, the process for manufacturing the display substrate is effectively simplified and the cost for manufacturing the display substrate is reduced.

It should be appreciated that, the above embodiments in the specification are described in a progressive manner, and for the description of a part in an embodiment, reference may be made to the description of a same or similar part in another embodiment, i.e., the description of each embodiment focuses on the difference from other embodiments. Particularly, since the method embodiment is substantially similar to the product embodiments, the method embodiment is described in a relatively brief manner, and for the description of a part of the method embodiment that is related to a product embodiment, reference may made to the description of the product embodiment.

Unless otherwise defined, any technical or scientific term used herein shall have the common meaning understood by a person of ordinary skills. Such words as "first" and "second" used in the present disclosure are merely used to differentiate different components rather than to represent any order, quantity or importance. Such words as "include" or "including" are intended to indicate that an element or object before the words encompasses elements or objects or equivalents thereof enumerated after the word, without excluding any other element or object. Such words as "connect/connected to" or "couple/coupled to" are not to be construed as being limited to physical or mechanical connection, rather, they may include electrical connection, direct or indirect. Such words as "on", "under", "left" and "right" are merely used to represent relative position relationship, and when an absolute position of the described object changes, the relative position relationship may changes correspondingly.

It should be appreciated that, when such an element as a layer, film, region or substrate is referred to as being arranged "on" or "under" another element, it may be directly arranged "on" or "under" the other element, or an intermediate element may exist.

In the above description, the specific features, structures, materials or characteristics may be combined in any embodiment or embodiments in an appropriate manner.

The aforementioned are merely specific implementations of the present disclosure, but the scope of the disclosure is by no means limited thereto. Any modifications or replacements that would easily occurred to those skilled in the art, without departing from the technical scope disclosed in the disclosure, should be encompassed in the scope of the present disclosure. Therefore, the scope of the present disclosure is to be determined by the scope of the claims.

What is claimed is:

1. A display substrate, comprising: a display region and a non-display region surrounding the display region;
   wherein the display substrate further comprises:
   an organic functional layer comprising a first portion located in the display region and a second portion located in the non-display region, wherein the second portion is provided with at least one isolation groove, and is partitioned into at least two separate sub-portions by the at least one isolation groove, and the at least two sub-portions are arranged sequentially along a first direction from the display region to a boundary of the display substrate;
   wherein the second portion is provided with a first isolation groove and a second isolation groove, and the first isolation groove is located between the display region and the second isolation groove;
   the second portion is partitioned by the first isolation groove and the second isolation groove into a first sub-portion, a second sub-portion and a third sub-portion, and the first sub-portion, the second sub-portion and the third sub-portion are separate from each other, and are sequentially arranged in a spaced manner along the first direction;
   wherein the display substrate further comprises:
   a circuit structure located in the non-display region, wherein an orthographic projection of the circuit structure onto a base substrate of the display substrate is covered by an orthographic projection of the second sub-portion onto the base substrate;
   a first signal line structure located in the non-display region, wherein an orthographic projection of the first signal line structure onto the base substrate is covered by an orthographic projection of the first sub-portion onto the base substrate;
   a second signal line structure located in the non-display region, wherein an orthographic projection of the second signal line structure onto the base substrate is covered by an orthographic projection of the third sub-portion onto the base substrate;
   wherein along the first direction, both a width of the first sub-portion and a width of the third sub-portion are smaller than a width of the second sub-portion.

2. The display substrate according to claim 1, wherein the at least one isolation groove surrounds the display region, each of the at least two sub-portions surrounds the display region, and the at least two sub-portions are arranged in a manner in which an outer sub-portion surrounds an inner sub-portion.

3. The display substrate according to claim 1, wherein the circuit structure comprises a gate driver circuit, a test circuit, and a multiplexing circuit;
   the first signal line structure comprises a power signal line; and
   the second signal line structure comprises a test signal line and a clock signal line.

4. The display substrate according to claim 1, wherein the organic functional layer comprises a first planarization layer, a second planarization layer and/or a pixel definition layer.

5. The display substrate according to claim 1, further comprising an electrically conductive functional pattern located in the non-display region, wherein an orthographic projection of the at least one isolation groove onto a base substrate of the display substrate does not overlap an orthographic projection of the electrically conductive functional pattern onto the base substrate.

6. The display substrate according to claim 1, further comprising an inorganic functional layer located in the non-display region, wherein an orthographic projection of the at least one isolation groove onto a base substrate of the display substrate overlaps an orthographic projection of the inorganic functional layer onto the base substrate.

7. A display device, comprising a display substrate, wherein the display substrate comprises: a display region and a non-display region surrounding the display region;
the display substrate further comprises:
an organic functional layer comprising a first portion located in the display region and a second portion located in the non-display region, wherein the second portion is provided with at least one isolation groove, and is partitioned into at least two separate sub-portions by the at least one isolation groove, and the at least two sub-portions are arranged sequentially along a first direction from the display region to a boundary of the display substrate;
wherein the second portion is provided with a first isolation groove and a second isolation groove, and the first isolation groove is located between the display region and the second isolation groove;
the second portion is partitioned by the first isolation groove and the second isolation groove into a first sub-portion, a second sub-portion and a third sub-portion, and the first sub-portion, the second sub-portion and the third sub-portion are separate from each other, and are sequentially arranged in a spaced manner along the first direction;
wherein the display substrate further comprises:
a circuit structure located in the non-display region, wherein an orthographic projection of the circuit structure onto a base substrate of the display substrate is covered by an orthographic projection of the second sub-portion onto the base substrate;
a first signal line structure located in the non-display region, wherein an orthographic projection of the first signal line structure onto the base substrate is covered by an orthographic projection of the first sub-portion onto the base substrate;
a second signal line structure located in the non-display region, wherein an orthographic projection of the second signal line structure onto the base substrate is covered by an orthographic projection of the third sub-portion onto the base substrate;
wherein along the first direction, both a width of the first sub-portion and a width of the third sub-portion are smaller than a width of the second sub-portion.

8. The display device according to claim 7, wherein the display device comprises a circular watch.

9. The display device according to claim 7, wherein the at least one isolation groove surrounds the display region, each of the at least two sub-portions surrounds the display region, and the at least two sub-portions are arranged in a manner in which an outer sub-portion surrounds an inner sub-portion.

10. The display device according to claim 7, wherein the circuit structure comprises a gate driver circuit, a test circuit, and a multiplexing circuit;
the first signal line structure comprises a power signal line; and
the second signal line structure comprises a test signal line and a clock signal line.

11. The display device according to claim 7, wherein the organic functional layer comprises a first planarization layer, a second planarization layer and/or a pixel definition layer.

12. The display device according to claim 7, further comprising an electrically conductive functional pattern located in the non-display region, wherein an orthographic projection of the at least one isolation groove onto a base substrate of the display substrate does not overlap an orthographic projection of the electrically conductive functional pattern onto the base substrate.

13. The display device according to claim 7, further comprising an inorganic functional layer located in the non-display region, wherein an orthographic projection of the at least one isolation groove onto a base substrate of the display substrate overlaps an orthographic projection of the inorganic functional layer onto the base substrate.

14. A method for manufacturing a display substrate, wherein the display substrate comprises a display region and a non-display region surrounding the display region, and the method comprises:
forming an organic functional layer, wherein the organic functional layer comprises a first portion located in the display region and a second portion located in the non-display region, the second portion is provided with at least one isolation groove, and is partitioned into at least two separate sub-portions by the at least one isolation groove, and the at least two sub-portions are arranged sequentially along a first direction from the display region to a boundary of the display substrate;
wherein the second portion is provided with a first isolation groove and a second isolation groove, and the first isolation groove is located between the display region and the second isolation groove;
the second portion is partitioned by the first isolation groove and the second isolation groove into a first sub-portion, a second sub-portion and a third sub-portion, and the first sub-portion, the second sub-portion and the third sub-portion are separate from each other, and are sequentially arranged in a spaced manner along the first direction;
wherein the display substrate further comprises:
a circuit structure located in the non-display region, wherein an orthographic projection of the circuit structure onto a base substrate of the display substrate is covered by an orthographic projection of the second sub-portion onto the base substrate;
a first signal line structure located in the non-display region, wherein an orthographic projection of the first signal line structure onto the base substrate is covered by an orthographic projection of the first sub-portion onto the base substrate;
a second signal line structure located in the non-display region, wherein an orthographic projection of the second signal line structure onto the base substrate is covered by an orthographic projection of the third sub-portion onto the base substrate;
wherein along the first direction, both a width of the first sub-portion and a width of the third sub-portion are smaller than a width of the second sub-portion.

15. The method for manufacturing the display substrate according to claim 14, wherein the organic functional layer comprises a planarization layer provided with a via-hole structure, and the via-hole structure is configured to connect an anode pattern to a corresponding sub-pixel driver circuit in the display substrate,
forming the at least one isolation groove in the organic functional layer specifically comprises: forming the via-hole structure and the at least one isolation groove simultaneously in one patterning process.

* * * * *